United States Patent
Chen et al.

(10) Patent No.: US 12,448,699 B2
(45) Date of Patent: Oct. 21, 2025

(54) CONTINUOUS PREPARATION METHOD OF LARGE-AREA SINGLE-CRYSTAL (100) COPPER FOIL

(71) Applicants: Nankai University, Tianjin (CN); Nankai Cangzhou Bohai New Area Green Chemical Research Co., Ltd., Cangzhou (CN)

(72) Inventors: Jun Chen, Tianjin (CN); Zhimeng Hao, Tianjin (CN); Zhenhua Yan, Tianjin (CN); Haixia Li, Tianjin (CN)

(73) Assignees: Nankai University, Tianjin (CN); Nankai Cangzhou Bohai New Area Green Chemical Research Co., Ltd., Cangzhou (CN)

( * ) Notice: Subject to any disclaimer, the term of this patent is extended or adjusted under 35 U.S.C. 154(b) by 0 days.

(21) Appl. No.: 19/075,353

(22) Filed: Mar. 10, 2025

(65) Prior Publication Data

US 2025/0290223 A1 Sep. 18, 2025

(51) Int. Cl.
*C30B 1/06* (2006.01)
*C30B 29/02* (2006.01)
*C30B 29/64* (2006.01)

(52) U.S. Cl.
CPC ............... *C30B 1/06* (2013.01); *C30B 29/02* (2013.01); *C30B 29/64* (2013.01)

(58) Field of Classification Search
CPC .. C30B 1/06; C30B 1/02; C30B 29/02; C30B 29/64
See application file for complete search history.

(56) References Cited

U.S. PATENT DOCUMENTS

| 2014/0342236 A1* | 11/2014 | Goyal | H01M 4/1395 429/209 |
| 2016/0108546 A1 | 4/2016 | Park et al. | |

FOREIGN PATENT DOCUMENTS

| CN | 104928649 A | 9/2015 | |
| CN | 105603518 A | 5/2016 | |
| CN | 108728813 A | * 11/2018 | ............. C30B 23/00 |
| CN | 111188085 A | 5/2020 | |
| CN | 111188086 A | 5/2020 | |
| CN | 112442729 A | * 3/2021 | ............... C30B 1/06 |
| CN | 115896912 A | 4/2023 | |
| CN | 116623300 A | 8/2023 | |
| CN | 118223106 A | 6/2024 | |

* cited by examiner

*Primary Examiner* — Robert M Kunemund

(57) ABSTRACT

Disclosed is a continuous preparation method of a large-area (100) single-crystal copper foil, a poly-crystal copper foil is connected to a reel-to-reel device, a carbon-based substrate is placed below the copper foil, and the large-area (100) single-crystal copper foil is prepared by applying a stress in a heat treatment process in a reducing/protective atmosphere under an environment with a temperature gradient. According to the invention, the stress is applied to the copper foil for the first time, and strain energy of the copper foil is accurately regulated and controlled, so as to make the strain energy become a main influence factor of grain boundary migration and lattice rotation, so that the strain energy in a growth process of the single-crystal copper foil is controlled to be dominant, and the large-area (100) single-crystal copper foil is controllably prepared through heat treatment in the reducing atmosphere.

8 Claims, 5 Drawing Sheets

CONTINUOUS PREPARATION METHOD OF LARGE-AREA SINGLE-CRYSTAL (100) COPPER FOIL

TECHNICAL FIELD

The present invention relates to the technical field of material science and electrochemistry, and particularly to a continuous preparation method of a large-area (100) single-crystal copper foil.

BACKGROUND OF THE PRESENT INVENTION

Single-crystal copper foil has important application prospects in many fields, such as selective catalysis, battery current collector, power transmission and crystal epitaxial growth, because of its intrinsic excellent electrical and thermal conductivity and single crystal orientation.

A traditional method for preparing a single-crystal copper foil is complicated. A single-crystal copper ingot is prepared by a Czochralski method first, and then the single-crystal copper foil is obtained by mechanical cutting. This method has a high energy consumption, a high cost and a single crystal orientation, and is difficult to realize large-scale preparation and unable to control a thickness to a micron level. A new method for preparing the single-crystal copper foil promotes lattice rotation and grain boundary migration through heat treatment, so as to obtain a single-crystal copper foil with lowest Gibbs free energy exposed. At present, there have been reports on the successful preparation of the single-crystal copper foil. For example, CN115896912 A discloses a preparation method and device of a large-area single-crystal copper foil, wherein the large-area (111) single-crystal copper foil is prepared through heat treatment. However, the large-area single-crystal (100) copper foil cannot be prepared by this method.

SUMMARY OF THE PRESENT INVENTION

Aiming at the technical defect that only (111) crystal plane preparation is controllable in the prior art, the present invention is intended to provide a continuous preparation method of a large-area (100) single-crystal copper foil.

The technical solution used to achieve the objective of the present invention is as follows.

A continuous preparation method of a large-area single-crystal copper foil is provided, wherein a poly-crystal copper foil is connected to a reel-to-reel device, a carbon-based substrate is placed below the copper foil, and the large-area (100) single-crystal copper foil is prepared by applying a stress in a heat treatment process in a reducing/protective atmosphere under an environment with a temperature gradient.

It is found by the present invention for the first time that, the stress needs to be applied to the copper foil, strain energy in a growth process of the single-crystal copper foil is controlled to be dominant, so as to make the strain energy become a main influence factor of grain boundary migration and lattice rotation, and then the large-area (100) single-crystal copper foil is prepared.

In the above technical solution, a thickness of the commercial poly-crystal copper foil is 10 μm to 100 μm.

In the above technical solution, the temperature gradient is 1° C. to 10° C. per centimeter.

In the above technical solution, a range of the applied stress is 80 N to 100 N per square centimeter (of cross-sectional area).

In the above technical solution, the preparation method comprises the following steps:
step 101: pretreating the poly-crystal copper foil to remove an organic layer, an oxide layer and impurities;
step 102: connecting the pretreated poly-crystal copper foil to the reel-to-reel device to send the copper foil into a multi-temperature-zone tube furnace, and using the carbon-based substrate placed on a corundum plate or a quartz plate as a support below the copper foil;
step 201: vacuumizing an interior of the multi-temperature-zone tube furnace, and introducing reducing/protecting gas to reach a preset pressure; and
step 202: heating the copper foil under the condition of continuously introducing the reducing/protecting gas until a highest temperature in a center of the copper foil is 980° C. to 1070° C., applying the stress for 10 minutes to 30 minutes, subjecting the copper foil to heat preservation for 4 hours to 15 hours at the same time, and naturally cooling the copper foil to room temperature, so as to obtain the (100) single-crystal copper foil.

In the above technical solution, a method of the pretreating in the step 1 comprises soaking the poly-crystal copper foil in dilute sulfuric acid or dilute hydrochloric acid, then washing the copper foil with deionized water and anhydrous ethanol or anhydrous methanol or anhydrous acetone alternately, and drying the copper foil by cold air blowing or dust-free paper suction. Preferably, a concentration of the dilute sulfuric acid or the dilute hydrochloric acid is 0.2 mol/L to 1 mol/L.

In the above technical solution, the carbon-based substrate in the step 2 is commercial carbon paper, carbon cloth and carbon felt, or a substrate with a plane, which is made of a carbon material by a series of methods such as pressing or film extracting.

In the above technical solution, the preset pressure in the step 3 is 1 atmospheric pressure.

In the above technical solution, the reducing/protecting gas in the step 3 and the step 4 is mixed gas of hydrogen and argon or hydrogen and nitrogen, a proportion of the hydrogen is 10% to 50%, and a total gas flow is 100 sccm to 800 sccm.

In the above technical solution, the poly-crystal copper foil is sent into a tube furnace through a reel-to-reel device and the stress is applied, so that the (100) single-crystal copper foil obtained in the step 4 can reach a meter level; and a size of the (100) single-crystal copper foil obtained in the step 4 may be adjusted by improving the design of multi-temperature-zone tube furnace.

In the above technical solution, a feeding reel and a receiving reel are arranged in the multi-temperature-zone tube furnace, the feeding reel is used for winding the poly-crystal copper foil, the receiving reel is used for winding the prepared single-crystal copper foil, the feeding reel and the collecting reel are respectively located at on left and right sides of a heating zone, and after the stress is applied, the copper foil may be moved to one temperature zone, wherein a moving speed of the copper foil is 0.1 cm/min to 1 cm/min, so as to realize the continuous preparation of the meter-level (100) single-crystal copper foil.

In another aspect of the present invention, a continuous preparation device of a large-area (100) single-crystal copper foil is provided, which comprises a multi-temperature-zone tube furnace, and a feeding reel and a receiving reel which are arranged in the multi-temperature-zone tube furnace, wherein the feeding reel is used for winding a poly-crystal copper foil, in which fixing and feeding are controlled by a program, the receiving reel is used for winding a single-crystal copper foil, in which a rotating speed and clockwise and counterclockwise directions are controlled by a program, a stress is applied on the copper foil by tightening the reels, the stress may be accurately controlled in real time through a digital display screen, the feeding reel and the receiving reel are respectively located on the left and right sides of the heating zone, the heating zone comprises at least three temperature zones, a bottom portion of the heating zone is provided with a quartz plate, a carbon-based substrate is fixedly arranged on the quartz plate or a corundum plate, and when the copper foil is moved, the copper foil is suspended or a bottom surface of the copper foil is attached to the carbon-based substrate.

The preparation method and device of the single-crystal copper foil of the present invention may also be used for preparing other single-crystal metal foils. In addition to the copper foil, the other metal foils may also comprise a platinum foil, a cobalt foil, a nickel foil, a nickel-platinum alloy foil, a copper-nickel alloy foil, and the like.

Compared with the prior art, the present invention has the beneficial effects as follows.

1. According to the present invention, the stress is applied to the copper foil for the first time, and strain energy of the copper foil is accurately regulated and controlled, so as to make the strain energy become a main influence factor of grain boundary migration and lattice rotation, so that the strain energy in a growth process of the single-crystal copper foil is controlled to be dominant, and the large-area (100) single-crystal copper foil is controllably prepared through heat treatment in the reducing atmosphere.
2. According to the present invention, the tube furnace with the reel-to-reel function is adopted to realize the controllable preparation of the large-area (100) single-crystal copper foil. The repeatability is high, and the device and the single-crystal copper foil may both be produced in batches, thus facilitating popularization and application.
3. The original commercial poly-crystal copper foil adopted in the present invention is simple and easy to obtain, low in price and abundant, and the single-crystallization process is simple to operate and achieves high product purity. Compared with the traditional Czochralski method, the preparation method reduces the energy consumption and the pollution introduced from the outside in the preparation process.
4. The method and device involved in the present invention have universality for preparing various single-crystal metal foils.

DETAILED DESCRIPTION OF PREFERRED EMBODIMENTS

The present invention is further described in detail hereinafter with reference to specific embodiments. It should be understood that the specific embodiments described herein are only used for explaining the present invention and are not intended to limit the present invention.

Embodiment 1

A continuous preparation method of a large-area (100) single-crystal copper foil comprised the following steps.

Figure 1:
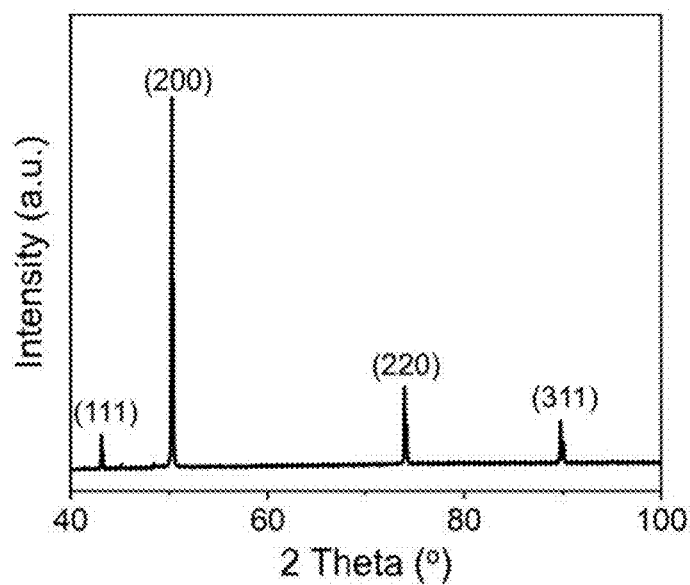
FIG. 1 is an XRD pattern of a commercial poly-crystal copper foil used in the present invention.

In step 1, a commercial poly-crystal copper foil with a thickness of 10 μm (an XRD pattern of the copper foil was as shown in FIG. 1) was soaked in 1 mol/L dilute hydrochloric acid, then washed with deionized water and anhydrous acetone, and dried by cold air blowing.

In step 2, the poly-crystal copper foil was connected to a reel-to-reel device to send the copper foil into a three-temperature-zone tube furnace, and carbon cloth placed on a quartz plate was used as a support below the copper foil.

In step 3, an interior of the tube furnace in the step 2 was vacuumized, reducing gas (mixed gas of hydrogen and argon, a proportion of the hydrogen was 40%) was introduced until a pressure of the tube furnace was 1 atmosphere pressure, and set temperature values of three temperature zones were 700° C., 1050° C. and 700° C. respectively, so that a position of the copper foil reached a preset temperature gradient.

In step 4, the reducing gas (the mixed gas of hydrogen and argon, the proportion of the hydrogen was 40%) was continuously introduced into the tube furnace in the step 3, with a gas flow rate of 400 sccm, the copper foil was heated to 1050° C., and then a stress of 80 N/cm$^2$ was applied to the copper foil through the reel-to-reel device for 10 minutes. The copper foil was heated for 10 hours, and naturally cooled to room temperature, so as to obtain the (100) single-crystal copper foil.

Figure 2:
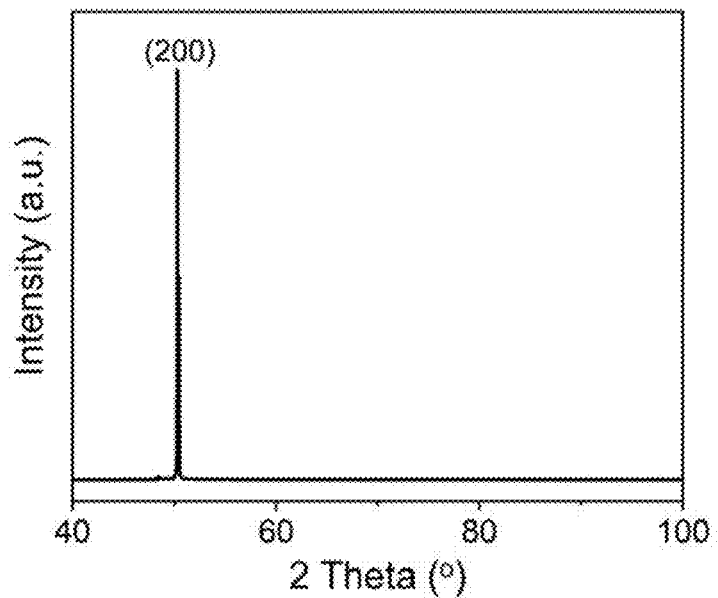
FIG. 2 is an XRD pattern of a (100) single-crystal copper foil obtained in the present invention.
Figure 3:
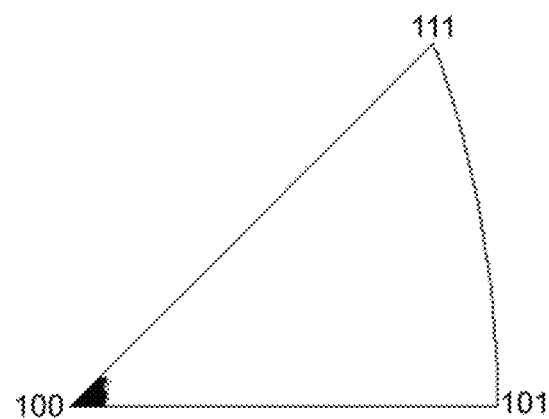
FIG. 3 is an inverse pole figure of a (100) single-crystal copper foil in Embodiment 1 of the present invention.

FIG. 2 is an XRD pattern of the (100) single-crystal copper foil obtained in Embodiment 1. It can be seen from the figure that the copper foil after heat treatment has only one peak, corresponds to a (200) crystal plane of copper, and belongs to a {100} crystal plane family. FIG. 3 is an inverse pole figure of the (100) single-crystal copper foil obtained in Embodiment 1. It can be seen from the figure that the copper foil after heat treatment corresponds to a (100) crystal plane of copper, and has no grain boundary.

Comparative Example 1

This comparative example was different from Embodiment 1 that carbon paper was not used, while other conditions were the same as those of Embodiment 1, and the preparation method specifically comprised the following steps.

In step 1, a commercial poly-crystal copper foil with a thickness of 10 μm was soaked in 1 mol/L dilute hydrochloric acid, then washed with deionized water and anhydrous acetone, and dried by cold air blowing.

In step 2, the poly-crystal copper foil was connected to a reel-to-reel device to send the copper foil into a three-temperature-zone tube furnace, and a quartz plate was used as a support below the copper foil.

In step 3, an interior of the tube furnace in the step 2 was vacuumized, reducing gas (mixed gas of hydrogen and argon, a proportion of the hydrogen was 40%) was introduced until a pressure of the tube furnace was 1 atmosphere pressure, and set temperature values of three temperature zones were 700° C., 1050° C. and 700° C. respectively, so that a position of the copper foil reached a preset temperature gradient.

In step 4, the reducing gas (the mixed gas of hydrogen and argon, the proportion of the hydrogen was 40%) was continuously introduced into the tube furnace in the step 3, with a gas flow rate of 400 sccm, the copper foil was heated to 1050° C., and then a stress of 80 N/cm$^2$ was applied to the copper foil through the reel-to-reel device for 10 minutes. The copper foil was heated for 10 hours, and naturally cooled to room temperature, so as to obtain the poly-crystal copper foil.

Figure 4:
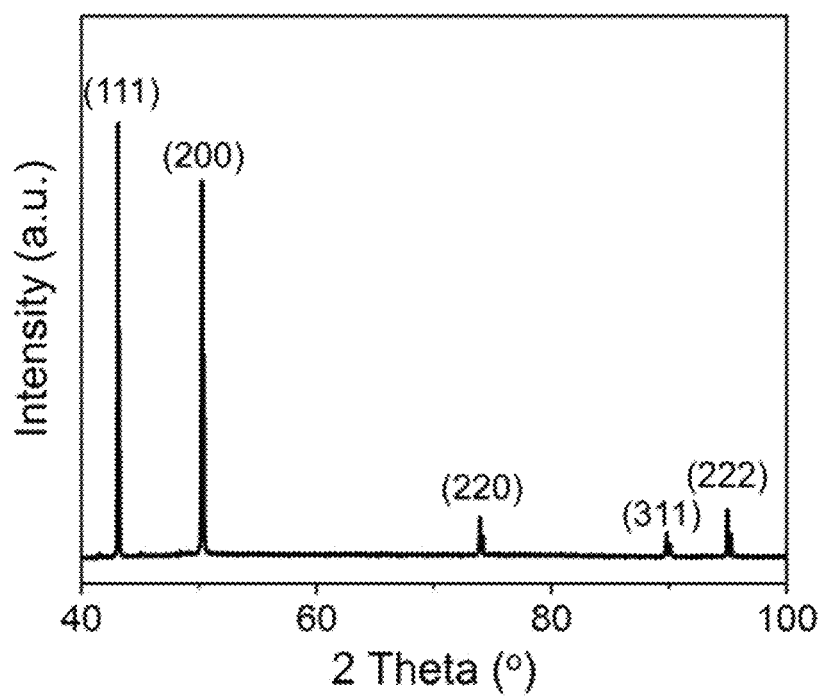
FIG. 4 is an XRD pattern of a poly-crystal copper foil in Comparative Example 1 of the present invention.

FIG. 4 is an XRD pattern of the poly-crystal copper foil obtained in Comparative Example 1. It can be seen from the figure that the copper foil after heat treatment has many crystal planes, and is the poly-crystal copper foil. Compared with Embodiment 1, Comparative Example 1 proves the necessity of carbon paper for preparing the (100) single-crystal copper foil.

Comparative Example 2

This comparative example was different from Embodiment 1 in stress application, while other conditions were the same, and the preparation method specifically comprised the following steps.

In step 1, a commercial poly-crystal copper foil with a thickness of 10 μm was soaked in 1 mol/L dilute hydrochloric acid, then washed with deionized water and anhydrous acetone, and dried by cold air blowing.

In step 2, the poly-crystal copper foil was connected to a reel-to-reel device to send the copper foil into a three-temperature-zone tube furnace, and carbon cloth placed on a quartz plate was used as a support below the copper foil.

In step 3, an interior of the tube furnace in the step 2 was vacuumized, reducing gas (mixed gas of hydrogen and argon, a proportion of the hydrogen was 40%) was introduced until a pressure of the tube furnace was 1 atmosphere pressure, and set temperature values of three temperature zones were 700° C., 1050° C. and 700° C. respectively, so that a position of the copper foil reached a preset temperature gradient.

In step 4, the reducing gas (the mixed gas of hydrogen and argon, the proportion of the hydrogen was 40%) was continuously introduced into the tube furnace in the step 3, with a gas flow rate of 400 sccm, the copper foil was heated to 1050° C., and then a stress of 40 N/cm$^2$ was applied to the copper foil through the reel-to-reel device for 10 minutes. The copper foil was heated for 10 hours, and naturally cooled to room temperature, so as to obtain the poly-crystal copper foil.

Figure 5:
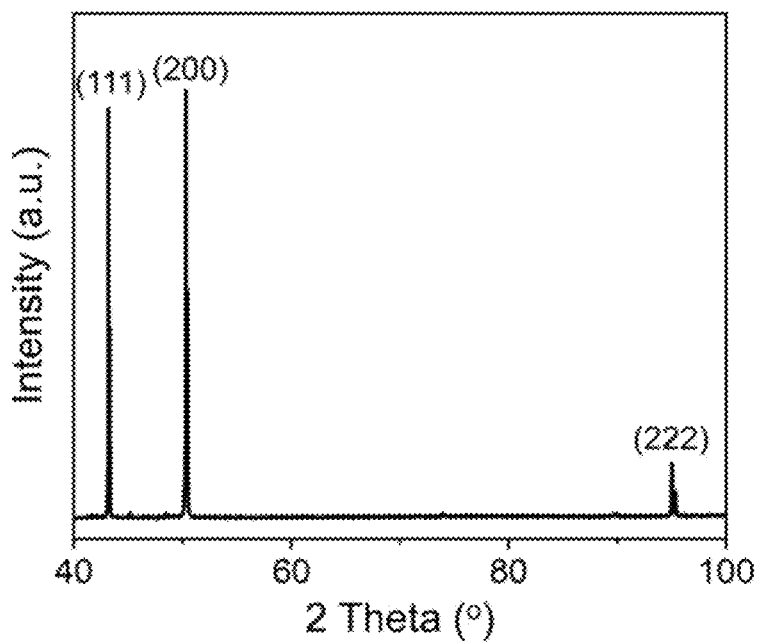
FIG. 5 is an XRD pattern of a poly-crystal copper foil in Comparative Example 2 of the present invention.

FIG. 5 is an XRD pattern of the poly-crystal copper foil obtained in Comparative Example 2. It can be seen from the figure that the copper foil after heat treatment has many crystal planes on surface, and is the poly-crystal copper foil. Compared with Embodiment 1, it is proved that the change of the stress applied to the copper foil will affect a dominant relationship of crystal plane free energy, thus affecting the growth of the (100) single-crystal copper foil. It is concluded that a proper stress is very important for the growth of the (100) single-crystal copper foil.

Comparative Example 3

This comparative example was different from Embodiment 1 in stress application, while other conditions were the same, and the preparation method specifically comprised the following steps.

In step 1, a commercial poly-crystal copper foil with a thickness of 10 μm was soaked in 1 mol/L dilute hydrochloric acid, then washed with deionized water and anhydrous acetone, and dried by cold air blowing.

In step 2, the poly-crystal copper foil was connected to a reel-to-reel device to send the copper foil into a three-temperature-zone tube furnace, and carbon cloth placed on a quartz plate was used as a support below the copper foil.

In step 3, an interior of the tube furnace in the step 2 was vacuumized, reducing gas (mixed gas of hydrogen and argon, a proportion of the hydrogen was 40%) was introduced until a pressure of the tube furnace was 1 atmosphere pressure, and set temperature values of three temperature zones were 700° C., 1050° C. and 700° C. respectively, so that a position of the copper foil reached a preset temperature gradient.

In step 4, the reducing gas (the mixed gas of hydrogen and argon, the proportion of the hydrogen was 40%) was continuously introduced into the tube furnace in the step 3, with a gas flow rate of 400 sccm, the copper foil was heated to 1050° C., and then a stress of 150N/cm$^2$ was applied to the copper foil through the reel-to-reel device for 10 minutes. The copper foil was heated for 10 hours, and naturally cooled to room temperature, so as to obtain the poly-crystal copper foil.

Figure 6:
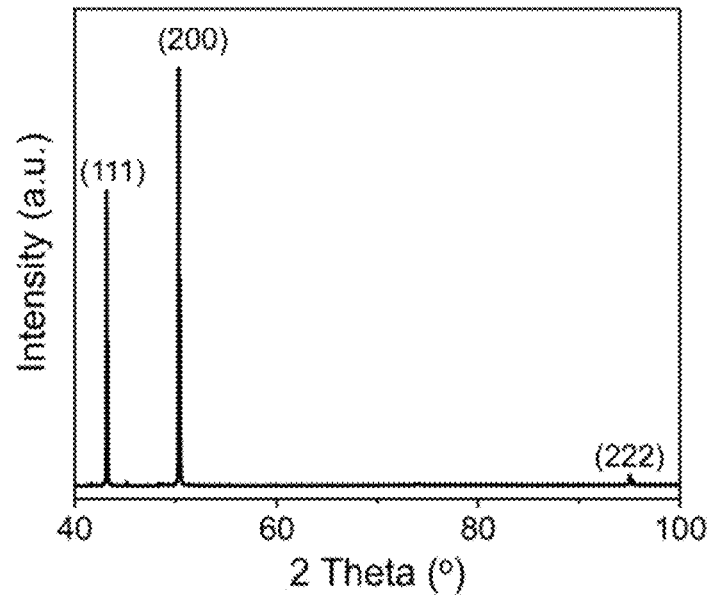
FIG. 6 is an XRD pattern of a poly-crystal copper foil in Comparative Example 3 of the present invention.

FIG. 6 is an XRD pattern of the poly-crystal copper foil obtained in Comparative Example 3. It can be seen from the figure that the copper foil after heat treatment has many crystal planes on surface, and is the poly-crystal copper foil. Compared with Embodiment 1, it is proved that an excessively large stress will lead to a certain degree of tensile deformation of the copper foil, thus affecting the growth of the (100) single-crystal copper foil. It is concluded that a proper stress is very important for the growth of the (100) single-crystal copper foil.

Embodiment 2

A continuous preparation method of a large-area single-crystal copper foil comprised the following steps.

In step 1, a commercial poly-crystal copper foil with a thickness of 30 μm was soaked in 1 mol/L dilute sulfuric acid, then washed with deionized water and anhydrous methanol, and dried by cold air blowing.

In step 2, the copper foil obtained in the step 1 was connected to a reel-to-reel device to send the copper foil into a three-temperature-zone tube furnace, and carbon paper placed on a quartz plate was used as a support below the copper foil.

In step 3, an interior of the tube furnace in the step 2 was vacuumized, reducing gas (mixed gas of hydrogen and nitrogen, a proportion of the hydrogen was 30%) was introduced until a pressure of the tube furnace was 1 atmosphere pressure, and set temperature values of three temperature zones were 600° C., 1045° C. and 600° C. respectively, so that a position of the copper foil reached a preset temperature gradient.

In step 4, the reducing gas (the mixed gas of hydrogen and argon, the proportion of the hydrogen was 40%) was continuously introduced into the tube furnace in the step 3, with a gas flow rate of 400 sccm, the copper foil was heated to 1050° C., and then a stress of 100 N/cm$^2$ was applied to the copper foil through the reel-to-reel device for 15 minutes. The copper foil was heated for 8 hours, and naturally cooled to room temperature, so as to obtain the (100) single-crystal copper foil.

Figure 7:
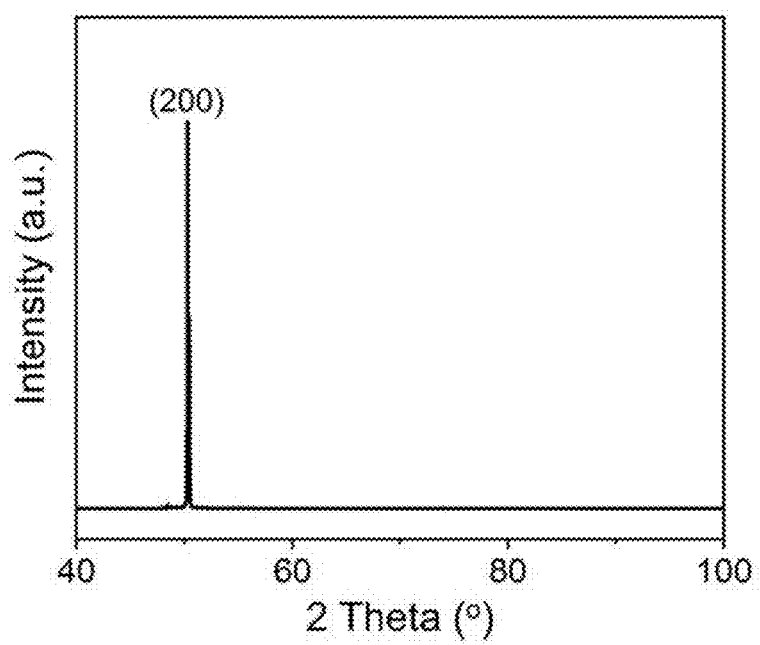
FIG. 7 is an XRD pattern of a (100) single-crystal copper foil in Embodiment 2 of the present invention.
Figure 8:
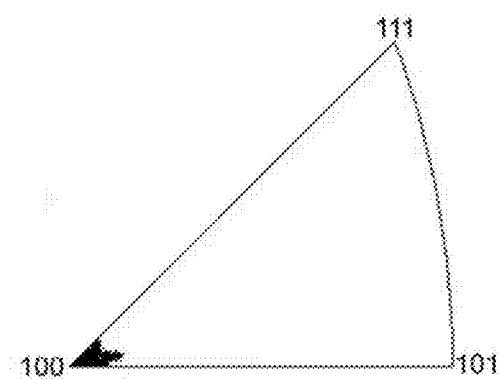
FIG. 8 is an inverse pole figure of the (100) single-crystal copper foil in Embodiment 2 of the present invention.

FIG. 7 is an XRD pattern of the (100) single-crystal copper foil obtained in Embodiment 2. It can be seen from the figure that the copper foil after heat treatment has only one peak, corresponds to a (200) crystal plane of copper, and belongs to a {100} crystal plane family. FIG. 8 is an inverse pole figure of the (100) single-crystal copper foil obtained in Embodiment 2. It can be seen from the figure that the copper foil after heat treatment corresponds to a (100) crystal plane of copper, and has no grain boundary.

Embodiment 3

Figure 9:
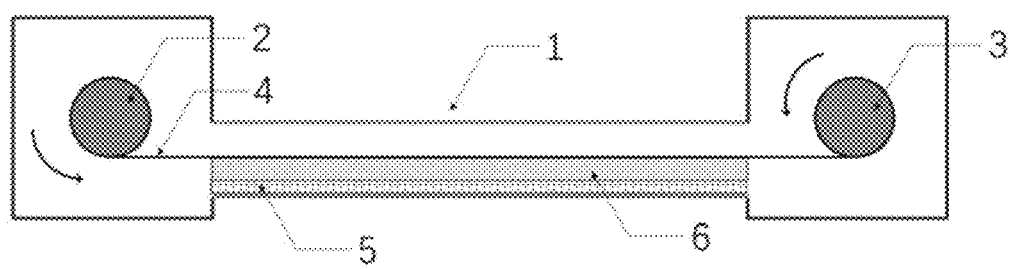
FIG. 9 is a schematic diagram of an internal structure of a multi-temperature-zone tube furnace with a reel-to-reel function in Embodiment 3 of the present invention.

As shown in FIG. 9, a continuous preparation device of a large-area (100) single-crystal copper foil comprises a sealed multi-temperature-zone tube furnace consisting of a heating zone 1, and a feeding reel 2 and a receiving reel 3 which are arranged on two sides of the heating zone 1, and a chamber where the reels are located is communicated with the heating zone 1. The feeding reel 2 is used for winding a poly-crystal copper foil 4, in which fixing or feeding is controlled by a program, the receiving reel 3 is used for winding a single-crystal copper foil, in which a rotating speed and clockwise and counterclockwise directions are controlled by a program, a stress is applied on the copper foil by tightening the reels, the stress may be accurately controlled in real time through a digital display screen, the heating zone 1 comprises at least three temperature zones, a bottom portion of the heating zone is provided with a corundum plate 5, carbon paper 6 is fixedly arranged on a quartz plate or the corundum plate, and when the copper foil is moved, the copper foil is suspended or a bottom surface of the copper foil is attached to the carbon-based substrate.

Preferably, lengths of the corundum plate 5 and the carbon paper 6 are equal to a length of the heating zone 1.

Embodiment 4

The device in Embodiment 3 was used for preparing a large-area (100) single-crystal copper foil in this embodiment, and a continuous preparation method of the large-area (100) single-crystal copper foil comprised the following steps.

In step 1, a commercial poly-crystal copper foil with a thickness of 10 μm was soaked in 1 mol/L dilute sulfuric acid, then washed with deionized water and anhydrous ethanol, and dried by cold air blowing.

In step 2, the poly-crystal copper foil obtained in the step 1 was wound on a feeding reel 1, so that a part of the copper foil was supported by carbon paper and a quartz plate, and then connected to a receiving reel 2.

In step 3, an interior of the tube furnace in the step 2 was vacuumized, reducing gas (mixed gas of hydrogen and argon, a proportion of the hydrogen was 30%) was introduced until a pressure of the tube furnace was 1 atmosphere pressure, and set temperature values of three temperature zones were 700° C., 1050° C. and 700° C. respectively, so that a position of the copper foil reached a preset temperature gradient.

In step 4, the reducing gas (the mixed gas of hydrogen and argon, the proportion of the hydrogen was 40%) was continuously introduced into the tube furnace in the step 3, with a gas flow rate of 500 sccm, and the copper foil was heated to 1050° C.

In step 5, a stress of 90 N/cm$^2$ was applied to the copper foil through the reel-to-reel device for 10 minutes, and the copper foil was heated for 4 hours.

In step 6, after heating for 4 hours, the copper foil in the step 2 was set to be moved for 50 cm at a moving speed of 1 cm/min.

In step 7, the step 5 and the step 6 were repeated until one roll of copper foil was completely converted, and the copper foil was naturally cooled to room temperature, so as to obtain the meter-level (100) single-crystal copper foil.

Figure 10:
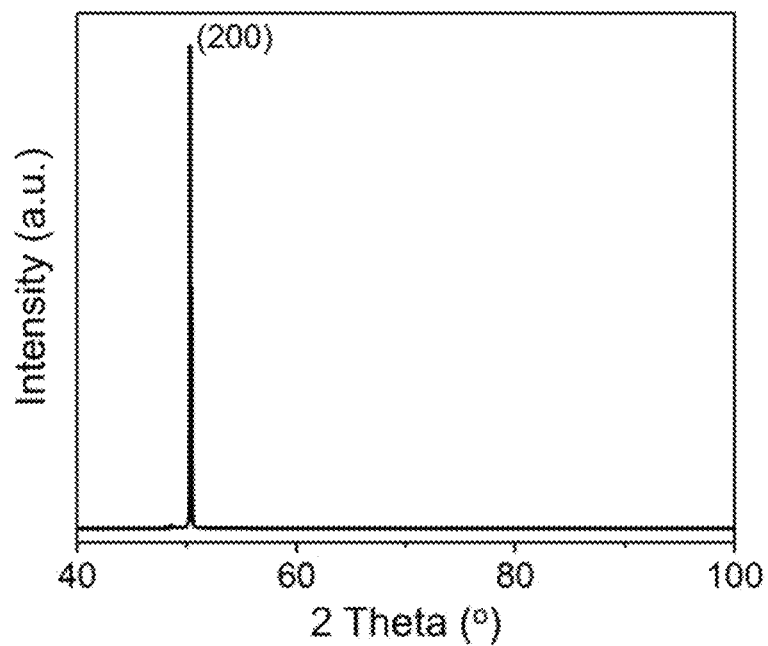
FIG. 10 is an XRD pattern of a (100) single-crystal copper foil in Embodiment 4 of the present invention.
Figure 11:
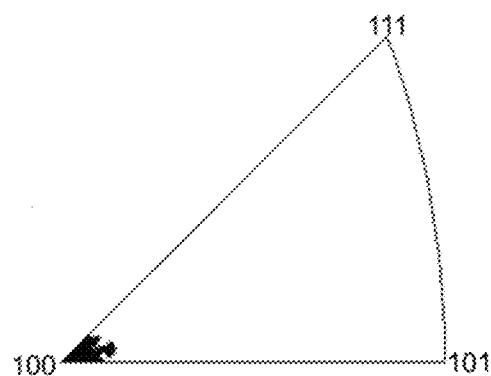
FIG. 11 is an inverse pole figure of the (100) single-crystal copper foil in Embodiment 4 of the present invention.

FIG. 10 is an XRD pattern of the (100) single-crystal copper foil obtained in Embodiment 4. It can be seen from the figure that the copper foil after heat treatment has only one peak, corresponds to a (200) crystal plane of copper, and belongs to a {100} crystal plane family. FIG. 11 is an inverse pole figure of the (100) single-crystal copper foil obtained in Embodiment 4. It can be seen from the figure that the copper foil after heat treatment corresponds to a (100) crystal plane of copper, and has no grain boundary.

The above are only the preferred embodiments of the present invention, and it should be pointed out that those of ordinary skills in the art may further make several improvements and decorations without departing from the principle of the present invention, and these improvements and decorations should also be regarded as falling within the scope of protection of the present invention.

We claim:

1. A continuous preparation method of a large-area (100) single-crystal copper foil, wherein a commercial poly-crystal copper foil is connected to a reel-to-reel device, a carbon-based substrate is placed below the commercial poly-crystal copper foil, strain energy in a growth process of the single-crystal copper foil is controlled to be dominant by applying a stress in a heat treatment process in a reducing/productive atmosphere under an environment with a temperature gradient, so as to make the strain energy become a main influence factor of grain boundary migration and lattice rotation, and then the large-are (100) single-crystal copper foil is prepared; and the preparation method comprises the following steps:

step 1: pretreating the commercial poly-crystal copper foil to remove an organic layer, an oxide layer and impurities;

step 2: connecting the pretreated commercial poly-crystal copper foil to the reel-to-reel device to send the copper foil into a multi-temperature-zone tube furnace, and using the carbon-based substrate placed on a corundum plate or a quartz plate as a support below the commercial poly-crystal copper foil;

step 3: vacuumizing an interior of the multi-temperature-zone tube furnace, and introducing reducing/protecting gas to reach a preset pressure; and step 4: heating the copper foil under the condition of continuously introducing the reducing/protecting gas until a highest temperature in a center of the copper foil is 980° C. to 1070° C., applying a stress of 80 N to 100 N per square centimeter of cross-sectional area by tightening reels of the reel-to-reel device for 10 minutes to 30 minutes, subjecting the copper foil to heat preservation for 4 hours to 15 hours at the same time, and naturally cooling the copper foil to room temperature, so as to obtain the (100) single-crystal copper foil.

2. The preparation method according to claim 1, wherein a thickness of the commercial poly-crystal copper foil is 10 μm to 100 μm.

3. The preparation method according to claim 1, wherein the temperature gradient is 1° C. to 10° C. per centimeter.

4. The preparation method according to claim 1, wherein a range of the applied stress is 80 N to 100 N per square centimeter of cross-sectional area.

5. The preparation method according to claim 1, wherein a method of the pretreating in the step 1 comprises soaking the commercial poly-crystal copper foil in dilute sulfuric acid or dilute hydrochloric acid, then washing the copper foil with deionized water and anhydrous ethanol or anhydrous methanol or anhydrous acetone alternately, and drying the copper foil by cold air blowing or dust-free paper suction, wherein a concentration of the dilute sulfuric acid or the dilute hydrochloric acid is 0.2 mol/L to 1 mol/L.

6. The preparation method according to claim 1, wherein the carbon-based substrate in the step 2 is commercial carbon paper, carbon cloth and carbon felt, or a substrate with a plane, which is made of a carbon material by a pressing or film extracting method.

7. The preparation method according to claim 1, wherein the reducing/protecting gas in the step 3 and the step 4 is mixed gas of hydrogen and argon or hydrogen and nitrogen, a proportion of the hydrogen is 10% to 50%, and a total gas flow is 100 sccm to 800 sccm.

8. The preparation method according to claim 1, wherein the preset pressure in the step 3 is 1 atmospheric pressure.

* * * * *